United States Patent
Matsui

(10) Patent No.: US 12,050,134 B2
(45) Date of Patent: Jul. 30, 2024

(54) OPTICAL SENSOR

(71) Applicant: Murata Manufacturing Co., Ltd., Nagaokakyo (JP)

(72) Inventor: Masatsugu Matsui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 192 days.

(21) Appl. No.: 17/719,519

(22) Filed: Apr. 13, 2022

(65) Prior Publication Data

US 2022/0236112 A1 Jul. 28, 2022

Related U.S. Application Data

(63) Continuation of application No. PCT/JP2020/038501, filed on Oct. 12, 2020.

(30) Foreign Application Priority Data

Nov. 18, 2019 (JP) ................................. 2019-207694

(51) Int. Cl.
*G01J 5/04* (2006.01)
*G01J 5/02* (2022.01)
*G01J 5/0802* (2022.01)

(52) U.S. Cl.
CPC ............. *G01J 5/046* (2013.01); *G01J 5/0215* (2013.01); *G01J 5/0225* (2013.01); *G01J 5/0802* (2022.01)

(58) Field of Classification Search
CPC ........ G01J 5/046; G01J 5/0215; G01J 5/0225; G01J 5/0802; G01J 5/023; G01J 5/04; H01L 31/0203; H01L 31/02325
See application file for complete search history.

(56) References Cited

U.S. PATENT DOCUMENTS

| | | | |
|---|---|---|---|
| 4,808,812 A | 2/1989 | Tanaka et al. | |
| 6,294,783 B1 | 9/2001 | Hayashi | |
| 9,761,740 B2* | 9/2017 | Reinert | G01J 5/20 |
| 11,339,494 B2* | 5/2022 | Nakajima | H01L 31/1075 |
| 2002/0175285 A1* | 11/2002 | Ito | G01J 5/34 250/338.3 |
| 2007/0114415 A1 | 5/2007 | Hayashi | |
| 2007/0176516 A1* | 8/2007 | Nagaya | G01P 15/0907 310/346 |
| 2008/0087824 A1 | 4/2008 | Hayashi et al. | |

(Continued)

FOREIGN PATENT DOCUMENTS

| | | | |
|---|---|---|---|
| CN | 106768389 A | 5/2017 | |
| JP | 63-176 A | 1/1988 | |

(Continued)

OTHER PUBLICATIONS

Official Communication issued in International Patent Application No. PCT/JP2020/038501, mailed on Dec. 28, 2020.

*Primary Examiner* — David P Porta
*Assistant Examiner* — Gisselle M Gutierrez
(74) *Attorney, Agent, or Firm* — Keating & Bennett, LLP

(57) ABSTRACT

An optical sensor includes a light receiver, a circuit portion having an electronic component electrically connected to the light receiver, a metal cap covering an upper portion of the light receiver and includes a cavity facing the light receiver, an optical filter in the cavity of the metal cap, and a metal stem connected to the metal cap, and the circuit portion is on the metal stem.

16 Claims, 3 Drawing Sheets

(56) References Cited

U.S. PATENT DOCUMENTS

| | | | | |
|---|---|---|---|---|
| 2010/0006315 A1* | 1/2010 | Kumatani | ............... | H01L 23/10 |
| | | | | 174/50.5 |
| 2011/0114840 A1* | 5/2011 | Yamazaki | ............... | H01L 21/54 |
| | | | | 29/841 |
| 2011/0266443 A1* | 11/2011 | Schimert | ................ | G01J 5/024 |
| | | | | 250/353 |
| 2012/0228503 A1* | 9/2012 | Nishikawa | ................ | G01J 5/04 |
| | | | | 250/338.3 |
| 2012/0298867 A1* | 11/2012 | Nishikawa | ........... | G01J 5/0018 |
| | | | | 250/338.3 |
| 2013/0126735 A1 | 5/2013 | Plotz et al. | | |
| 2016/0049434 A1 | 2/2016 | Barlow et al. | | |
| 2019/0316967 A1* | 10/2019 | Schieferdecker | ..... | G01J 5/0853 |
| 2020/0120806 A1* | 4/2020 | Kusuyama | ........... | H05K 3/4661 |
| 2022/0236111 A1* | 7/2022 | Eiyama | ................ | G01J 5/0225 |
| 2023/0123432 A1* | 4/2023 | Fujihara | ................ | H01L 25/167 |
| | | | | 257/692 |
| 2023/0194350 A1* | 6/2023 | Takiguchi | ............. | G01J 5/0007 |
| | | | | 374/130 |
| 2023/0397354 A1* | 12/2023 | Hung | ..................... | G01N 21/01 |

FOREIGN PATENT DOCUMENTS

| | | | | |
|---|---|---|---|---|
| JP | 06-28663 U | 4/1994 | | |
| JP | 11-108757 A | 4/1999 | | |
| JP | 2001-124624 A | 5/2001 | | |
| JP | 2011-237451 A | 11/2011 | | |
| JP | 2011237451 A * | 11/2011 | ............... | G01J 1/02 |
| JP | 2012-013584 A | 1/2012 | | |
| JP | 2013-524178 A | 6/2013 | | |
| JP | 2016-042080 A | 3/2016 | | |
| WO | 2006/009174 A1 | 1/2006 | | |
| WO | 2006/120863 A1 | 11/2006 | | |

\* cited by examiner

OPTICAL SENSOR

CROSS REFERENCE TO RELATED APPLICATIONS

This application claims the benefit of priority to Japanese Patent Application No. 2019-207694 filed on Nov. 18, 2019 and is a Continuation Application of PCT Application No. PCT/JP2020/038501 filed on Oct. 12, 2020. The entire contents of each application are hereby incorporated herein by reference.

BACKGROUND OF THE INVENTION

1. Field of the Invention

The present invention relates to an optical sensor, and more particularly, to a light-receiving device such as an infrared sensor.

2. Description of the Related Art

There are two types of electronic components, that is, a through hole mount device (THD) having a lead terminal and a surface mount device (SMD). The THD is mounted on a substrate having a through-hole. Meanwhile, the SMD is mounted on a surface of a substrate. Similarly, optical sensors such as infrared sensors are classified into two types, that is, a THD and an SMD.

Japanese Unexamined Patent Application Publication No. 2013-524178 discloses a radiation sensor including a radiation sensing element, a housing including a metal cap in which the radiation sensing element is stored, a plurality of terminals, and a circuit. Japanese Unexamined Patent Application Publication No. 11-108757 discloses an infrared sensor including a pyroelectric element, a substrate, and a stem including a metal base and a terminal. Japanese Unexamined Patent Application Publication No. 63-176 discloses an optical sensor in which at least two light-receiving elements are integrally molded with a transparent resin. Japanese Unexamined Patent Application Publication No. 2001-124624 discloses an infrared sensor in which a sensor part in which an infrared detection element and a room temperature detection element are sealed in a metal package is mounted on a substrate having a lead.

The radiation sensor described in Japanese Unexamined Patent Application Publication No. 2013-524178, the infrared sensor described in Japanese Unexamined Patent Application Publication No. 11-108757, the optical sensor described in Japanese Unexamined Patent Application Publication No. 63-176, and the infrared sensor described in Japanese Unexamined Patent Application Publication No. 2001-124624 are THDs.

Japanese Unexamined Patent Application Publication No. 2016-42080 discloses a radiation sensing device including a radiation sensor chip, an integrated circuit chip coupled with the radiation sensor chip, and an electrical connection provided on a bottom surface of the integrated circuit chip. Japanese Unexamined Patent Application Publication No. 2012-13584 discloses a pyroelectric infrared sensor including a sensor element, a circuit board, a resin holder on which the circuit board is mounted, a shield case that covers an outer peripheral surface of the resin holder, and an output terminal. WO2006/009174A1 discloses an infrared sensor including a pyroelectric element and a base. WO2006/120863A1 discloses an infrared sensor in which an infrared sensor element is stored in a metal package having a box shape. Inside the package, a circuit portion connected to the infrared sensor element is provided. The radiation sensing device described in Japanese Unexamined Patent Application Publication No. 2016-42080, the pyroelectric infrared sensor described in Japanese Unexamined Patent Application Publication No. 2012-13584, the infrared sensor described in WO2006/009174A1, and the infrared sensor described in WO2006/120863A1 are SMDs.

As described above, the radiation sensor described in Japanese Unexamined Patent Application Publication No. 2013-524178, the infrared sensor described in Japanese Unexamined Patent Application Publication No. 11-108757, the optical sensor described in Japanese Unexamined Patent Application Publication No. 63-176, and the infrared sensor described in Japanese Unexamined Patent Application Publication No. 2001-124624 are THDs. A substrate on which a THD is mounted needs to be provided with a through-hole. However, the presence of a through-hole makes it difficult to increase a mounting density and reduce a size of the substrate. Furthermore, a THD cannot be reflow-mounted, and therefore, a THD and an SMD cannot be concurrently mounted on a single substrate. This requires a step of mounting a THD and a step of mounting an SMD. Accordingly, in a case where it is necessary to increase a mounting density and reduce a size of a substrate, an SMD, which can be mounted without a through-hole in a substrate, is suitable.

In an infrared sensor that is a THD, a cap made of a metal is used as an immunity measure. The cap defines and functions as an electromagnetic shield that protects an infrared sensor element from an electromagnetic wave. Although the radiation sensing device described in Japanese Unexamined Patent Application Publication No. 2016-42080 is an SMD, there is a possibility that the radiation sensing device described in Japanese Unexamined Patent Application Publication No. 2016-42080 malfunctions due to an influence of an electromagnetic wave from an outside since a member defining and functioning as an electromagnetic shield is not provided.

Although the pyroelectric infrared sensor described in Japanese Unexamined Patent Application Publication No. 2012-13584 is an SMD and includes a shield case, the shield case has cavities facing each other, and therefore there is a possibility that the pyroelectric infrared sensor described in Japanese Unexamined Patent Application Publication No. 2012-13584 malfunctions due to an influence of an electromagnetic wave entering from the cavities.

Although the infrared sensor described in WO2006/009174A1 is an SMD and includes a case including a frame made of a metal, the case has cavities facing each other, and therefore there is a possibility that the infrared sensor described in WO2006/009174A1 malfunctions due to an influence of an electromagnetic wave entering from the cavities.

Although the infrared sensor described in WO2006/120863A1 is an SMD and includes a package made of a metal, an electronic component that defines a circuit portion is disposed around an infrared sensor element inside the package, and therefore it is difficult to reduce a size.

SUMMARY OF THE INVENTION

Preferred embodiments of the present invention provide small-sized optical sensors such as infrared sensors that are each an SMD and are each less likely to malfunction due to an influence of an outside electromagnetic wave.

An optical sensor according to a preferred embodiment of the present invention includes a light receiver, a circuit portion including an electronic component electrically connected to the light receiver, a metal cap covering an upper portion of the light receiver and including a cavity facing the light receiver, an optical filter in the cavity of the metal cap, and a metal stem connected to the metal cap, wherein the circuit portion is located on the metal stem.

Optical sensors according to preferred embodiments of the present invention each include a metal cap covering an upper portion of a light receiver and a metal stem and are each less likely to malfunction due to an influence of an electromagnetic wave from an outside.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
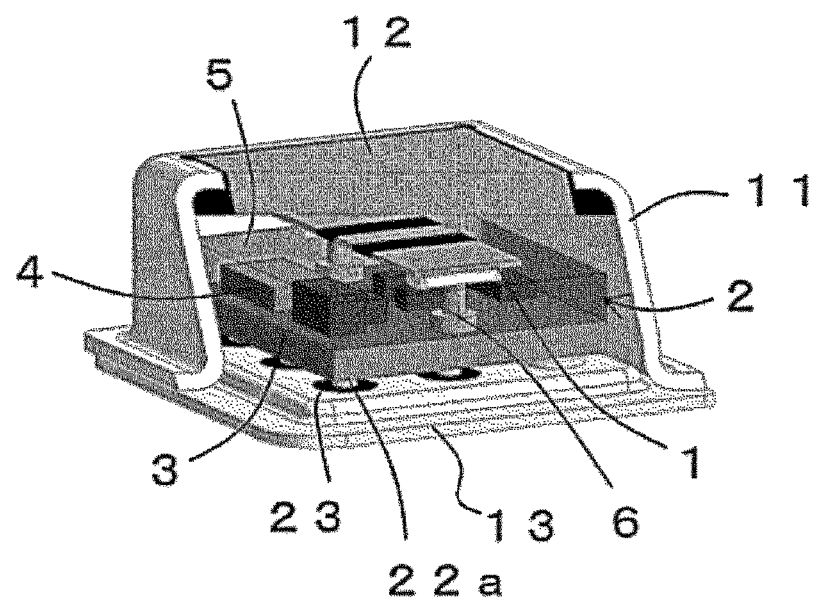
FIG. 1 is a schematic perspective view illustrating a configuration of an optical sensor according to Preferred Embodiment 1 of the present invention.

An optical sensor according to a preferred embodiment of the present invention includes a light receiver, a circuit portion including an electronic component electrically connected to the light receiver, a metal cap covering an upper portion of the light receiver and including a cavity facing the light receiver, an optical filter in the cavity of the metal cap, and a metal stem connected to the metal cap, wherein the circuit portion is located on the metal stem.

According to this configuration, the optical sensor includes the metal cap that covers an upper portion of the light receiver and the metal stem and is therefore less likely to malfunction due to an influence of an outside electromagnetic wave.

The optical sensor may be configured such that the metal stem is made of a metal and includes a body portion whose central portion protrudes from an outer peripheral portion thereof, and the circuit portion is located on the body portion.

The optical sensor may be configured such that the metal stem includes a terminal connected to the circuit portion.

According to this configuration, a terminal can extend through a curved bottom surface of the metal stem, and therefore, insulation can be achieved, for example, by providing an insulating portion on the curved surface, and thus a reduction in height can be achieved.

The optical sensor may be configured such that the circuit portion includes a substrate, an electronic component on the substrate, a resin covering the electronic component, and a metal pillar electrically connected to the electronic component and includes a portion covered with the resin and a portion exposed from the resin, and the light receiver is located on the circuit portion.

According to this configuration, the light receiver is located on the circuit portion, and therefore a reduction in size can be achieved, and a degree of design freedom of the light receiver and the circuit portion can be increased.

The optical sensor may be configured such that the light receiver is connected to the electronic component by the metal pillar on the resin.

The light receiver is electrically and mechanically joined to the metal pillar.

The optical sensor may be configured such that the substrate includes a pad and a via hole, and the light receiver is electrically connected to the electronic component on the substrate with the pad and the via hole interposed therebetween.

According to this configuration, the portion of the metal pillar exposed from the resin defines and functions as an external terminal.

The optical sensor may be configured such that the light receiver is a pyroelectric element.

Optical sensors according to preferred embodiments are described below with reference to the accompanying drawings. The same or substantially the same elements and features are denoted by the same reference signs in the drawings.

Preferred Embodiment 1

Figure 2:
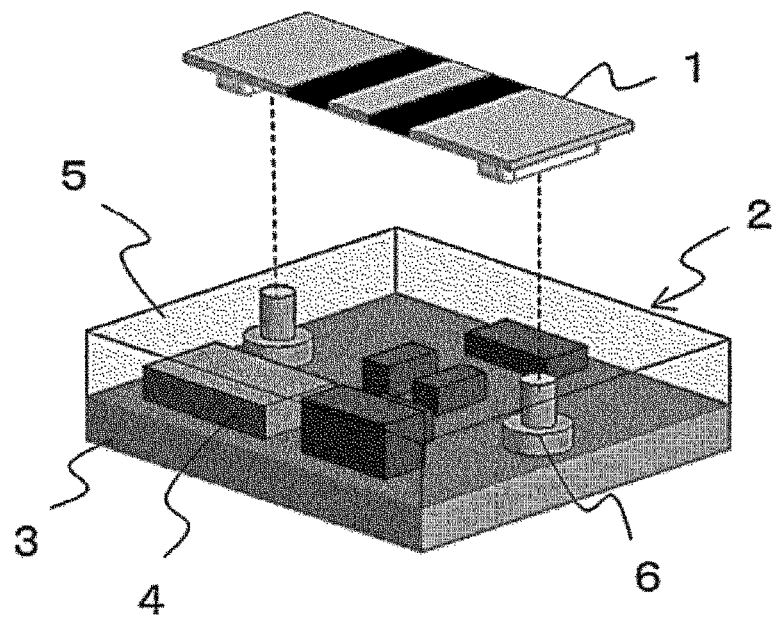
FIG. 2 is a schematic perspective view illustrating configurations of a light receiver and a circuit portion of the optical sensor of FIG. 1.

FIG. 1 is a schematic perspective view illustrating a configuration of an optical sensor 20 according to Preferred Embodiment 1 of the present invention. FIG. 2 is a schematic perspective view illustrating configurations of a light receiver and a circuit portion of the optical sensor of FIG. 1.

In FIG. 1, an internal configuration is illustrated while omitting a portion of a metal cap 11 and a portion of an optical filter 12.

The optical sensor 20 includes a light receiver 1, a circuit portion 2 electrically connected to the light receiver 1, the metal cap 11, the optical filter 12, and a metal stem 13. The metal cap 11 covers the light receiver 1 and includes a cavity facing the light receiver 1. The optical filter 12 is provided in the cavity of the metal cap 11. The metal stem 13 is electrically connected to the metal cap 11.

The light receiver 1 and the circuit portion 2 are mounted in a cavity inside a package defined by the metal cap 11 and the metal stem 13, as illustrated in FIG. 1.

With this configuration, the light receiver 1 and the circuit portion 2 can be protected.

The optical sensor 20 includes the metal cap 11 and the metal stem 13, and therefore is less likely to malfunction due to an influence of an electromagnetic wave from an outside.

Members and features of the optical sensor 20 are described below.

Light Receiver

The light receiver 1 is, for example, an infrared sensor element such as a pyroelectric element made of pyroelectric ceramics polarized in a thickness direction. The infrared sensor element may be, for example, a dual infrared sensor element using a pyroelectric element. The dual infrared sensor element is configured such that two electrodes provided on a surface of the pyroelectric element are connected in series in opposite polarities so that noise concurrently input to the two electrodes is canceled.

Furthermore, the light receiver 1 is provided on the circuit portion 2, that is, on the resin 5 of the circuit portion 2. Since the light receiver 1 is provided on the circuit portion 2, a reduction in size can be achieved, and a degree of design freedom of the light receiver 1 and the circuit portion 2 can be increased. In a case where the light receiver 1 is, for example, a pyroelectric element having pyroelectricity, a heat capacity can be ensured, and therefore it is possible to prevent malfunction from occurring due to an influence of heat transmitted from an outside.

Circuit Portion

The circuit portion 2 performs, for example, voltage conversion or amplification of an electric signal output from the light receiver 1. As illustrated in FIG. 2, the circuit portion 2 includes the substrate 3, the electronic component 4 mounted on the substrate 3, the metal pillar 6, and the resin 5 that covers the electronic component 4 and a portion of the metal pillar 6.

Substrate

The substrate 3 may be any insulating substrate. The substrate 3 may be, for example, a glass epoxy substrate.

Electronic Component

The electronic component 4 is, for example, an IC device such as a field-effect transistor or a passive component such as a bypass capacitor or a resistor. The electronic component 4 is covered with the resin 5, as described above.

Note that the electronic component 4 is connected to the light receiver 1 with the metal pillar 6 interposed therebetween.

Metal Pillar

The metal pillar 6 may be, for example, any columnar body made of a metal. The metal pillar 6 is mounted on the substrate 3 and is electrically connected to the electronic component 4. Furthermore, a portion of the metal pillar 6 is covered with the resin 5, and another portion of the metal pillar 6 is exposed from the resin 5 and is electrically and mechanically connected to the light receiver 1.

Resin

The resin 5 covers the electronic component 4. Since the electronic component 4 is covered with the resin 5, an insulating property of the electronic component 4 is ensured. The resin 5 is, for example, an epoxy resin, a urethane resin, or a silicone resin. The resin 5 may have a light shielding property. This makes it possible to prevent the electronic component 4 from malfunctioning due to an influence of light from an outside even in a case where the electronic component 4 is an IC device. Since the electronic component 4 and a portion of the metal pillar 6 are covered with the resin 5, the circuit portion 2 has water resistance, moisture resistance, and impact resistance.

Metal Cap

The metal cap 11 is, for example, made of a metal such as phosphor bronze, brass, iron, nickel silver, or 42Ni. Note that the metal cap 11 is not limited to these metals and may be made of other metals.

Optical Filter

The optical filter 12 allows light of a wavelength to be detected by the optical sensor 20 to pass therethrough. For example, in a case where the optical sensor 20 is an infrared sensor, an optical filter that allows an infrared ray having a predetermined wavelength to pass therethrough is used as the optical filter 12.

Furthermore, for example, the optical filter 12 has a shape corresponding to or substantially corresponding to the shape of the cavity of the metal cap 11, as illustrated in FIG. 1.

Note that the shape of the optical filter 12 is not limited to this and may be a shape different from the cavity of the metal cap 11.

Metal Stem

Figure 3A:
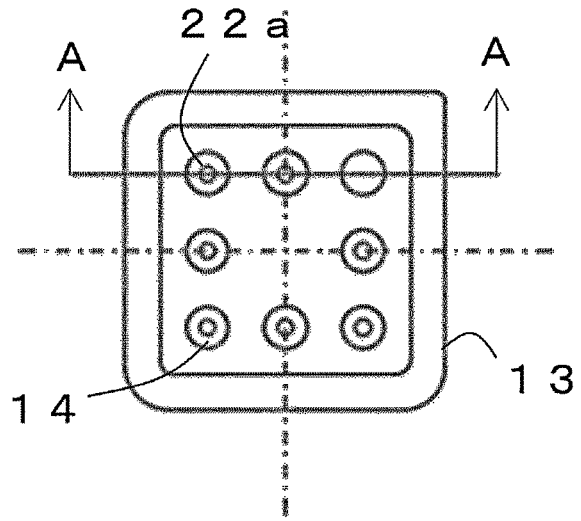
FIG. 3A is a plan view of a metal stem on a bottom surface of the optical sensor of FIG. 1.
Figure 3B:
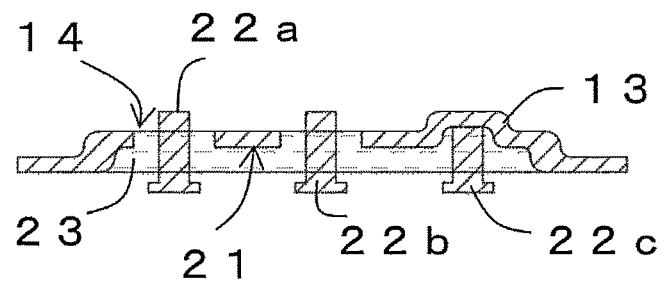
FIG. 3B is a schematic cross-sectional view illustrating a cross-sectional configuration taken along line A-A in FIG. 3A.
Figure 3C:
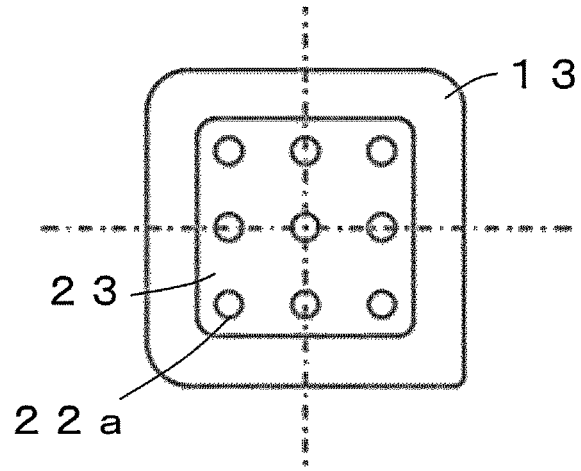
FIG. 3C is a bottom view of the metal stem of FIG. 3A.

FIG. 3A is a plan view of a metal stem 13 on a bottom surface of the optical sensor 20 of FIG. 1. FIG. 3B is a schematic cross-sectional view illustrating a cross section configuration taken along line A-A of FIG. 3A. FIG. 3C is a bottom view of the metal stem 13 of FIG. 3A.

As illustrated in FIG. 1, the circuit portion 2 is located on the metal stem 13. As illustrated in FIGS. 3A to 3C, the metal stem 13 includes a body portion 21, terminals 22a, 22b, and 22c, and an insulating portion 23. The body portion 21 is, for example, formed by drawing. The body portion 21 is made of a metal the same as or similar to a metal of which the metal cap 11 is made. The body portion 21 may be made of a metal different from the metal of which the metal cap 11 is made. Since the body portion 21 is made of a metal, the metal stem 13 is joined to the metal cap 11 by welding. A central portion of the body portion 21 protrudes from an outer peripheral portion thereof, and the central portion and the peripheral portion of the body portion 21 have the same or substantially the same thickness, and therefore the metal stem 13 includes a recess in a surface opposite to a surface facing the metal cap 11. As illustrated in FIG. 1, the circuit portion 2 is located on the body portion 21. The terminals 22a, 22b, and 22c are, for example, columnar bodies made of cobalt. The terminals 22a, 22b, and 22c are provided in through-holes provided in the body portion 21. The insulating portion 23 is, for example, made of glass, and is provided in the recess of the metal stem 13. As illustrated in FIG. 3B, the insulating portion 23 fills the recess of the metal stem 13. Furthermore, the insulating portion is provided between the through-holes provided in the body portion 21 and the terminals 22a, 22b, and 22c, and the insulating portion 23 insulates the body portion 21 and the terminals 22a, 22b, and 22c from each other. As illustrated in FIGS. 1 and 3B, the terminal 22a and the terminal 22b are connected to the circuit portion 2, and the terminal 22c is connected to the body portion 21.

Method for Manufacturing Optical Sensor

A non-limiting example of a method for manufacturing the optical sensor 20 is described below.

The electronic component 4 is mounted on the substrate 3. The metal pillar 6 is provided. The metal pillar 6 may be provided by mounting a columnar conductor on the substrate 3 or may be formed by plating.

The electronic component 4 and the metal pillar 6 are covered with the resin 5. For example, the electronic component 4 and the metal pillar 6 may be covered with the resin 5 by molding.

A surface of the resin 5 is ground to expose a portion of the metal pillar 6 from the resin 5 while providing a flat surface.

The light receiver 1 is mounted on the resin 5 of the circuit portion 2. As illustrated in FIG. 1, the portion of the metal pillar 6 exposed from the resin 5 is electrically and mechanically joined to the light receiver 1.

The light receiver 1 and the circuit portion 2 are mounted on the metal stem 13.

The metal cap 11 provided with the optical filter 12 and the metal stem 13 are joined by welding.

In this way, the optical sensor 20 is obtained.

Preferred Embodiment 2

Figure 4:
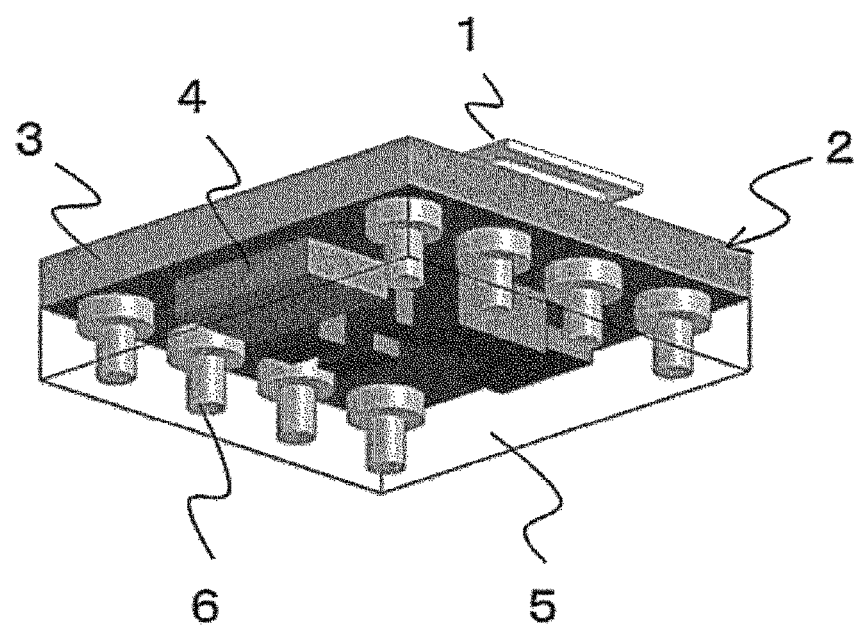
FIG. 4 is a schematic perspective view illustrating configurations of a light receiver and a circuit portion of an optical sensor according to Preferred Embodiment 2 of the present invention.

FIG. 4 is a schematic perspective view illustrating configurations of a light receiver and a circuit portion of an optical sensor according to Preferred Embodiment 2 of the present invention.

The optical sensor according to Preferred Embodiment 2 is different from the optical sensor 20 according to Preferred Embodiment 1 in that a light receiver 1 is connected to a substrate 3. Specifically, the substrate 3 includes a pad and a via hole (not illustrated), and the light receiver 1 is electrically connected to the electronic component 4 with the pad and the via hole of the substrate 3 interposed therebetween. Furthermore, a portion of a metal pillar 6 is exposed from a resin 5 and defines and functions as an external terminal.

Also in this case, the light receiver 1 is located on a circuit portion 2 as in Preferred Embodiment 1, and therefore a reduction in size can be achieved. Furthermore, a degree of design freedom of the light receiver 1 and the circuit portion 2 can be increased.

Method for Manufacturing Optical Sensor>

A non-limiting example of a method for manufacturing the optical sensor according to Preferred Embodiment 2 is described below.

The electronic component 4 and the metal pillar 6 are mounted on the substrate 3.

The electronic component 4 and the metal pillar 6 are covered with the resin 5. For example, the electronic component 4 and the metal pillar 6 may be covered with the resin 5 by molding.

A surface of the resin 5 is ground to expose a portion of the metal pillar 6 from the resin while providing a flat surface.

The light receiver 1 is mounted on the substrate 3 of the circuit portion 2. As illustrated in FIG. 4, the portion of the metal pillar 6 exposed from the resin 5 defines and functions as an external terminal.

The light receiver 1 and the circuit portion 2 are mounted on the metal stem 13.

The metal cap 11 provided with the optical filter 12 and the metal stem 13 are joined by welding.

In this way, the optical sensor according to Preferred Embodiment 2 is obtained.

The present disclosure includes appropriate combinations of any of various preferred embodiments and/or examples described above, and advantageous effects of the preferred embodiments and/or examples can be produced.

Optical sensors according to preferred embodiments of the present invention include a metal cap and a metal stem that cover an upper portion of a light receiver and is therefore less likely to malfunction due to an influence of an electromagnetic wave from an outside.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical sensor comprising:
a light receiver;
a circuit portion electrically connected to the light receiver;
a metal cap covering the light receiver and including a cavity facing the light receiver;
an optical filter in the cavity of the metal cap; and
a metal stem connected to the metal cap; wherein
the circuit portion is located on the metal stem;
the circuit portion includes a metal pillar and a resin covering a portion of the metal pillar;
the metal pillar includes a portion that is exposed from the resin and is electrically connected to the light receiver; and
at least a portion of the portion of the metal pillar that is exposed from the resin overlaps with the light receiver in a plan view.

2. The optical sensor according to claim 1, wherein
the metal stem is made of a metal and includes a body portion with a central portion protruding from an outer peripheral portion thereof; and
the circuit portion is on the body portion.

3. The optical sensor according to claim 2, wherein the metal stem includes a terminal connected to the circuit portion.

4. The optical sensor according to claim 1, wherein
the circuit portion includes a substrate and an electronic component on the substrate;
the resin covers the electronic component;
the metal pillar is electrically connected to the electronic component; and
the light receiver is located on the circuit portion.

5. The optical sensor according to claim 1, wherein the light receiver includes a pyroelectric element.

6. The optical sensor according to claim 5, wherein the pyroelectric element is made of a pyroelectric ceramic polarized in a thickness direction.

7. The optical sensor according to claim 1, wherein the substrate includes a glass epoxy.

8. The optical sensor according to claim 1, wherein the electronic component is an IC device or a passive component.

9. The optical sensor according to claim 1, wherein the resin includes at least one of an epoxy resin, a urethane resin, or a silicone resin.

10. The optical sensor according to claim 1, wherein the resin has a light shielding property.

11. An optical sensor comprising:
a light receiver;
a circuit portion electrically connected to the light receiver;
a metal cap covering the light receiver and including a cavity facing the light receiver;
an optical filter in the cavity of the metal cap; and
a metal stem connected to the metal cap; wherein
the circuit portion is located on the metal stem;
the circuit portion includes a substrate, an electronic component on the substrate, a resin covering the electronic component, and a metal pillar electrically connected to the electronic component and including a portion covered with the resin and a portion exposed from the resin; and
the light receiver is located on the circuit portion.

12. The optical sensor according to claim 11, wherein the light receiver is connected to the metal pillar on the resin.

13. The optical sensor according to claim 11, wherein
the substrate includes a pad and a via hole; and
the light receiver is electrically connected to the electronic component on the substrate with the pad and the via hole interposed therebetween.

14. The optical sensor according to claim 11, wherein the metal cap includes at least one of phosphor bronze, iron, nickel silver, or 42Ni.

15. The optical sensor according to claim 11, wherein the optical filter has a shape corresponding or substantially corresponding to a shape of the cavity.

16. The optical sensor according to claim 12, wherein
the metal stem includes a body portion, terminals, and an insulating portion;
the body portion is made of metal and connected to the metal cap.

\* \* \* \* \*